US010742068B2

(12) United States Patent
de Callafon et al.

(10) Patent No.: US 10,742,068 B2
(45) Date of Patent: Aug. 11, 2020

(54) REAL-TIME DEVIATION DETECTION OF POWER SYSTEM ELECTRICAL CHARACTERISTICS USING TIME-SYNCHRONIZED MEASUREMENTS

(71) Applicant: PXiSE Energy Solutions, LLC, San Diego, CA (US)

(72) Inventors: Raymond A. de Callafon, San Diego, CA (US); Charles H. Wells, San Diego, CA (US); Patrick T. Lee, San Diego, CA (US)

(73) Assignee: PXiSE Energy Solutions, LLC, San Diego, CA (US)

( * ) Notice: Subject to any disclaimer, the term of this patent is extended or adjusted under 35 U.S.C. 154(b) by 0 days.

(21) Appl. No.: 16/237,261

(22) Filed: Dec. 31, 2018

(65) Prior Publication Data
US 2020/0212709 A1 Jul. 2, 2020

(51) Int. Cl.
*H02J 13/00* (2006.01)
*H02J 3/00* (2006.01)
*G06Q 50/06* (2012.01)

(52) U.S. Cl.
CPC .......... *H02J 13/00001* (2020.01); *H02J 3/00* (2013.01); *G06Q 50/06* (2013.01); *H02J 3/001* (2020.01); *H02J 2203/20* (2020.01)

(58) Field of Classification Search
CPC .. G06Q 50/06; H02J 13/001; H02J 2003/001; H02J 2003/007; H02J 3/00
See application file for complete search history.

(56) References Cited

U.S. PATENT DOCUMENTS

2012/0022713 A1* 1/2012 Deaver, Sr. ............ G05B 17/02
700/298
2013/0226482 A1* 8/2013 Sun ........................ H02J 3/26
702/60

(Continued)

FOREIGN PATENT DOCUMENTS

EP         0 940 901 A2    9/1999
WO    WO-2018060130 A1 *  4/2018
WO       2018/234550 A1   12/2018

OTHER PUBLICATIONS

Misc. Authors, "Admittance" and "Thevenin's Theorem", Wikipedia (retrieved from <<https://en.wikipedia.org/w/index.php?title=Admittance&oldid=870237989>> and <<https://en.wikipedia.org/w/index.php?title=Th%C3%A9venin%27s_theorem&oldid=875536082>> on Jul. 30, 2019) (Year: 2018).*

(Continued)

*Primary Examiner* — Michael J Huntley
(74) *Attorney, Agent, or Firm* — Jones Day (57) ABSTRACT

Systems, methods, and products are described herein for identifying deviations within a power system. Using time-synchronized measurement devices, a set of voltages and currents associated with a plurality of electrical components within the power system are continuously measured. For each electrical component of the plurality of electrical components, a representative set of parameters are recursively determined based on the measured set of voltages and currents. For each electrical component, an electrical characteristic value is determined based on the representative set of parameters. For each electrical component, a deviation of the electrical component is identified based on comparison of the determined electrical characteristic value with a reference value of the electrical characteristic of the electrical component or based on identifying the deviation by means of a filtered rate of change. An alert of the deviation (Continued)

is provided for further characterization of an abnormality in the power system.

33 Claims, 5 Drawing Sheets

(56) References Cited

U.S. PATENT DOCUMENTS

| | | | | |
|---|---|---|---|---|
| 2014/0052391 A1* | 2/2014 | Feng | G01R 31/086 | 702/58 |
| 2014/0229127 A1 | 8/2014 | Ren et al. | | |
| 2014/0244065 A1* | 8/2014 | Biswas | H02J 3/00 | 700/298 |
| 2014/0336959 A1* | 11/2014 | Thomas | G01R 31/08 | 702/59 |
| 2014/0343879 A1* | 11/2014 | Glavic | G01R 27/16 | 702/64 |
| 2015/0025860 A1* | 1/2015 | Andresen | G01R 27/16 | 703/2 |
| 2015/0301101 A1* | 10/2015 | Abido | G01R 31/088 | 702/59 |
| 2015/0346286 A1* | 12/2015 | Janssen | H02J 3/00 | 702/58 |
| 2016/0322818 A1* | 11/2016 | Malengret | G06Q 50/06 | |
| 2016/0352142 A1* | 12/2016 | Hughes | H02J 13/0006 | |
| 2017/0025853 A1* | 1/2017 | Johansson | H02J 3/04 | |
| 2019/0288514 A1* | 9/2019 | Shukla | G05B 15/02 | |

OTHER PUBLICATIONS

Ardakanian et al., "On Identification of Distribution Grids," IEEE, DOI 10.1109/TCNS.2019.2891002 (2018).
Yang et al., "Online estimation and application of power grid impedance matrices based on synchronised phasor measurements," IET Generation, Transmission & Distribution, 4(9)1052-1059 (2010).
Patent Cooperation Treaty, International Search Report for Application No. PCT/US2019/068897, dated Apr. 17, 2020 (5 pages).
Patent Cooperation Treaty, Written Opinion for Application No. PCT/US2019/068897, dated Apr. 17, 2020 (8 pages).

* cited by examiner

REAL-TIME DEVIATION DETECTION OF POWER SYSTEM ELECTRICAL CHARACTERISTICS USING TIME-SYNCHRONIZED MEASUREMENTS

TECHNICAL FIELD

The current subject matter relates to electrical power grids and, more specifically, to methods and systems for estimating electrical characteristics of a power grid and detecting real-time deviations.

BACKGROUND

Electric power grids contain many devices that can restrict current flow. For example, such devices can include transformers, underground cables, overhead power lines, connectors, circuit breaker, and switch contacts, electric motors, and/or generators. The impedance of a device, defined by a ratio between voltage and current and measured in the units of ohm ($\Omega$), can characterize an amount of current flow restriction. A mathematical inverse of an impedance can be an admittance, defined by a ratio between current and voltage and measured in the units of mho ($1/\Omega$). In some single-phase alternating current (AC) power systems there are two conductors such as two-phase conductors or one phase conductor and one neutral conductor. The conductors can connect electrical components of the power system. Depending on how the electrical components are connected in a three-phase AC power system, the power system can be operated as a 3-wire three-phase system without a neutral conductor or a 4-wire three-phase system with a common neutral conductor.

In addition, AC voltage and current may be amplified or reduced by means of a transformer or a power electronic device functions like a static VAR compensator. With power flow being the product of voltage and current, amplification of the voltage can reduce the current to enable the same power flow as done in a transformer. The gain of a transformer, defined by a ratio between input current and output current or the ratio between input voltage and output voltage is typically unitless. Current flow reduction can lead to less power loss when transmitting power through a power line. Transformers are therefore essential components in AC power transmission and distribution circuits.

Impedance, admittance or gain of electrical components in a power grid may be characterized by a representative set of parameters that may consist of complex valued numbers. Deviations in the complex valued numbers representing impedance, admittance, gain, or a deviation in the filtered rate of change of the characteristic value of electrical components may indicate abnormalities, changes or nonconformities of the power system.

SUMMARY

In one aspect, deviations within a power system are identified by continuously measuring, using time-synchronized measurement devices, a set of voltages and currents associated with a plurality of electrical components within the power system. For each electrical component of the plurality of electrical components, a representative set of parameters are recursively determined based on the measured set of voltages and currents. For each electrical component, an electrical characteristic value is determined based on the representative set of parameters. For each electrical component, a deviation of the electrical component is identified based on comparison of the determined electrical characteristic value with a reference value of the electrical characteristic of the electrical component or a deviation in the filtered rate of change of the characteristic value. An alert of the deviation is provided for further characterization of an abnormality in the power system.

In some variations, the providing causes a remedial action to be taken in the power system. The remedial action can include at least one of: automatically alerting a power system operator via a visual or data interface of the deviation, automatically isolating at least one electrical component of the plurality of electrical components from the power system, or automatically initiating a new set point based on the deviation.

In other variations, the electrical component can be a transformer, a sectionalizing device, a power line segment, an electrical substation, a portion of a transmission system, or a portion of a distribution feeder in the power system.

In some variations, the reference value can be one of a previously recursively determined steady state electrical characteristic value or a predetermined reference value.

In other variations, the deviation indicates a fault on a power line of the power system. A distance to the fault can be determined based on recursive calculations of a change between the electrical characteristic value at a first measurement time and a second measurement time each provided by the time-synchronized measurement devices.

In some variations, the electrical characteristic value can be determined at an electrical point of the power system or across at least two electrical points of the power system.

In other variations, the electrical characteristic value can include at least one of: an impedance or admittance across a transformer of the power system, a voltage reduction of the transformer of the power system, an amplification of the transformer, a current reduction of the transformer, an amplification of the transformer, an impedance across a power line segment of the power system, an admittance across the power line segment, or an impedance at a measuring point of at least one time-synchronized measurement device of the time-synchronized measurement devices between a load coupled to the power system and the power system.

In some variations, the power system can be a single-phase electrical power grid and the representative set of parameters are determined using a Thevenin equivalent impedance model represented by: $v=gi$, where v is a voltage phasor, i is a current phasor, and g is a Thevenin equivalent value of impedance.

In other variations, the electrical power system is a single-phase electrical power grid and the representative set of parameters are determined using a Thevenin equivalent admittance model represented by: $i=yv$, where v is a voltage phasor, i is a current phasor, and y is a Thevenin equivalent value of admittance.

In some variations, the power system can include a multi-phase electrical power grid and the representative set of parameters are determined using a Thevenin equivalent impedance model represented by: $V(t_j)=G\ I(t_j)$, where $V(t_j)$ is a multi-phase voltage phasor vector measured at a time instance j, $I(t_j)$ is a multi-phase current phasor vector measured at the time instance j, and G is a square symmetric matrix representing a Thevenin equivalent value for an impedance of a multi-phase system. The dimensions of the multi-phase voltage phasor vector, $V(t_j)$, the multi-phase current phasor vector, $I(t_j)$ and the square symmetric matrix, G, can be equal to a number of phases of the multi-phase electrical power grid. The multi-phase voltage phasor vector V($t_j$) can be determined at an electrical point of the multi-phase electrical power grid or determined as a voltage difference between at least two electrical points of the multi-phase electrical power grid.

In other variations, the power system can include a multi-phase electrical power grid and the representative set of parameters are determined using a Thevenin equivalent admittance model represented by: I($t_j$) =Y V($t_j$), where V($t_j$) is a multi-phase voltage phasor vector measured at a time instance j, I($t_j$) is a multi-phase current phasor vector measured at the time instance, j, and Y is a square symmetric matrix representing a Thevenin equivalent value for an admittance of the multi-phase electrical power grid. The dimensions of the multi-phase voltage phasor vector, V($t_j$), the multi-phase current phasor vector, I($t_j$) and the square symmetric matrix, Y, can be equal to a number of phases of the multi-phase electrical power grid. The multi-phase voltage phasor vector, V($t_j$), can be determined at an electrical point of the multi-phase electrical power grid or determined as a voltage difference between at least two electrical points of the multi-phase electrical power grid.

Systems are also described that include one or more data processors and memory storing instructions which when executed by one or more data processors perform operations described herein. Non-transitory computer program products (i.e., physically embodied computer program products) are also described that store instructions, which when executed by one or more data processors of one or more computing systems, cause at least one data processor to perform operations described herein. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The subject matter described herein provides many technical advantages. For example, use of the current subject matter provides an estimation of distance to a fault on a power line. Additionally, the estimation herein can utilize two or more measurements to determine complex impedance values of electrical components of a power system. Use of this subject matter can detect and alert users and initiate an adjustment of a remedial action scheme for control and protection of a power system when deviation of electrical characteristics are detected. For example, use of the current subject matter can detect and alert of power line faults on overhead or underground power systems, predict anomalies of impedance variations in a grid components, including changes in winding insulation or position and anomalies in the bushings or cooling system, and detect abnormal behavior of a motor or generation windings or in the case of a generation, poor control of the exciter circuits in the generator. The subject matter herein allows more accurate load flow calculations based on actual measurements of the admittance between buses.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

Like reference symbols in the various drawings indicate like elements.

DETAILED DESCRIPTION

An electric power system (EPS) can be made up of components, for example, transformers, underground cables, overhead power lines, connectors, circuit breaker and switch contacts, electric motors, generators, and/or other inverter-based distributed energy resources (DERs) which include solar photovoltaic resources, fuel cells, wind turbines, energy storage systems, and electric vehicle charging systems that have the ability to store or produce electric energy. These components can be found in single-phase alternating current (AC) power systems where there are two conductors such as two phase conductors or one phase conductor and one neutral conductor. The conductors and connectors can connect electrical components of the power system. Depending on how the electrical components are connected in a three-phase AC power system, the power system can be operated as a 3-wire three-phase system without a neutral conductor or a 4-wire three-phase system with a common neutral conductor. Each component can have specific electrical characteristics that can restrict current flow. The impedance of a device, measured in ohms ($\Omega$), can characterize an amount of current flow restriction. A mathematical inverse of an impedance can be an admittance, measured in mhos. Electrical components such as a transformer or a power electronic device functions like a static VAR compensator can amplified or reduced AC voltage and current. With power flow being the product of voltage and current, amplification of the voltage can reduce the current to enable the same power flow as done in a transformer. Current flow reduction can lead to less power loss when transmitting power through a power line. Transformers are therefore essential components in AC power transmission and distribution circuits.

An EPS can be controlled and operated using estimations of certain electrical characteristics of the EPS. For example, real-time signal processing technology can be used to determine certain characteristics such as impedances, admittances, and/or transformers' ratio change in form of gains. The characteristics and its variations can be estimated using time-synchronized power measurements at two points across an electrical component. Additionally, the electrical characteristics and its variances can be estimated at a single point in the grid using time-synchronized power measurements at that point, such as a point of interconnection (POI). The estimations can include a complex elements in a matrix using power measurements in form of voltage and current phasors.

The estimations described herein can use recursive moving window estimation techniques containing multiple time synchronized measurements of voltage or current phasors. The estimations can also provide higher accuracy of actual power flow through a device. Additionally, the estimations can have an associated uncertainty of accuracy. Multiple time synchronized measurements can be taken over time at one or more points in the grid to determine an estimate of complex impedance values and any associated uncertainty. The method described herein can use two or more values (e.g., time synchronized voltage and current measurements) to generate an impedance matrix characterizing a point of the EPS. Additionally, use of the subject matter herein can facilitate estimation of a distance to a fault on a power line by estimating the impedance change between two points of measurement.

Time synchronized voltage and current measurements can be obtained from synchro phasor measurements from one or more phasor measurement units (PMUs) or from sensors using other means of time synchronized measurements.

The subject matter herein provides a method of computing the electrical characteristics in an AC power system with one or more phases, an outline of several ways to use a moving window to recursively estimate and monitor the electrical parameters of major components in an AC grid such as the complex valued impedance, admittance and transformer gain, and estimates of the variance of the computed parameters. These electrical parameters and their variance can then be used to monitor the "health" of the major components in an AC grid as well as used in systems that control the magnitude and direction of power flow in the grid. Deviations can be identified based on the health of the components. An alert of the deviation can be provided for further characterization of an abnormality in the power system.

Power system data can be provided by one or more measurement devices in a grid providing one or more data packets. Power system data can include, for example any data related to the power system such as active (real) power, reactive power, frequency, voltage phasor, and/or current phasor. The power system data can be either measured directly from the power system and/or derived based on measurements of the power system by at least one PMU.

Various matrices can be used to compute electrical characteristics such as impedances or admittances of various electrical components of power system. For example, an alert of the deviation can be provided for further characterization of an abnormality in the power system. The alert can be generated based on one or more values of the various matrices, described in more detail to follow. In response to an alert, one of many different remedial actions can be taken within the power system. For example, the power system can automatically alert a power system operator via a visual or data interface of the deviation. The power system can automatically isolate at least one electrical component from the power system. A new set point can be generated for a controller or protective device responsible for the particular electrical component having the deviation in an attempt to remedy the deviation.

Linear combinations of the estimated values in the impedance matrix and its covariance matrix can be used to determine characteristics of the electrical components being monitored at various electrical points throughout the power system. The complex elements in these matrices can be normalized and deviations from normal behavior can be used to alert operators of the exceedances. Different equation weightings can be used to modify any deviations from nominal behavior of the one or more electrical components such as off diagonal elements.

Similarly, statistical time series error detection algorithms can be applied to each element of the impedance matrix to determine any anomalies of the power system, such as filtered rate of change exceedances. Additionally, big-data or artificial intelligence (AI) technology can be applied to cluster the elements of the impedance matrix, both the real and imaginary part. For example, one would expect a very small cluster of the diagonal elements of the matrix. If at any time, the boundaries of this cluster are exceeded, the operator can be alerted such as through an alert provided for display on a graphical user interface coupled to power system.

Each of the elements in the matrix can be monitored in real time and changes in the value can be detected and used to alert operators or initiate an update on a remedial action scheme. The filtered rates of change of each element in the impedance matrix could be computed and used to alert operators of changes. Additionally, the alerts can provide a prediction of a probable cause of a malfunction in power system. For example, an estimated distance to a fault can be determined by comparing characteristics and magnitudes of complex impedances between the sending and receiving points of a power line before and after a deviation is detected. If, for instance, the fault impedance is approximately 100 percent prior to the deviation and is approximately 40 percent after the deviation detection, the distance to the fault can be approximately 40 percent of the line length from sending point to receiving point.

Consider a single-phase waveform represented by:

$$v(t) = \overline{V} \cos(2\pi f t + \phi_v), \quad (1)$$

where $\overline{V}$ is the amplitude of the waveform, f is a fundamental AC frequency of the waveform (e.g., 45-65 Hz), t represents time, $\phi_v$ is the relative phase shift of the voltage, v(t), with respect to a cosine waveform represented by:

$$\cos(2\pi f t), \text{ and} \quad (2)$$

$$j^2 = -1. \quad (3)$$

A corresponding steady state voltage phasor can be represented by:

$$v = V e^{j\phi_v} \quad (4)$$

in polar coordinates, where V denotes the root mean square (RMS) value represented by:

$$V = \overline{V}/\sqrt{2} \quad (5)$$

and $\phi_v$ is the relative phase shift of the voltage v(t) with respect to a cosine waveform of Equation (2), and t represents a time initialized at a pre-defined reference point such as midnight. Similarly, the resulting single phase steady state current phasor in polar coordinates can be represented by:

$$i = I e^{j\phi_i} \quad (6)$$

where I denotes the RMS value of the current, i(t), $\phi_i$ is the relative phase shift of the current, i(t), and j obeys Equation (3). In some variations, synchronized measurements of voltage RMS, current RMS, voltage phase angle, and current phase angle of the waveform can be obtained from a synchronized measurement such as a measurement made by a PMU. In other variations, synchronized measurements of voltage RMS, current RMS, voltage phase angle, and current phase angle of the waveform can be obtained by any device that produces synchronized measurements of voltage RMS, current RMS, voltage phase angle, and/or current phase angle of a waveform can be used. A synchronized measurement of voltage RMS and voltage phase angle, when taken together, form a voltage phasor. A synchronized measurement of current RMS and current phase angle, when taken together, can form a current phasor.

In some variations, the current phasor, i, in Equation (6) can be related to the voltage phasor, v, in Equation (4) via the single-phase Ohm's law expressed by:

$$v = gi \qquad (7)$$

where g is the Thevenin equivalent single phase complex impedance of a component in the power system. In other variations, the current phasor, i, in Equation (6) can be related to the voltage phasor, v, in Equation (4) via the expression:

$$i = yv \qquad (8)$$

where y is the Thevenin equivalent single phase complex admittance of a component in the power system. In other variations, a voltage phasor, v, in Equation (4) can be related to a voltage phasor represented by:

$$u = Ue^{j\phi_u} \qquad (9)$$

where U denotes the RMS value of a voltage, u(t), and $\phi_u$ is the phase shift of the voltage, u(t). Due to the use of an AC transformer, the voltage, u(t), can change according to $$v = ku, \qquad (10)$$

where k is the Thevenin equivalent complex transformer voltage gain. An equivalent relationship between current phasors entering and leaving a transformer can also be used in yet other variations.

The complex value, g, k or y, can be represented by a Laplace transfer function, g(s), k(s) or y(s). For simplicity in this example, consider the complex impedance g as a general transfer function from an input to an output, which can be determined by evaluating the Laplace transfer function, g(s), at $$s = j2\pi f, \qquad (11)$$

where f is a fundamental AC frequency (e.g., 45-65 Hz) and j adheres to Equation (3). Furthermore, the complex value, g, can be a complex number represented by:

$$g = |g|e^{j\phi_g} \qquad (12)$$

in polar coordinates, where $$|g| = |g(j2\phi f)| \text{ and} \qquad (13)$$

$$\phi_g = \angle g(j2\phi f). \qquad (14)$$

As such, the single-phase Ohm's law of Equation (7) allows the single phase complex impedance g to be estimated or monitored by measuring the single-phase voltage phasor v and current phasor i. The complex impedance, g, can be estimated or monitored with relationships represented by:

$$g = |g|e^{j\phi_g} = \frac{v}{i} \in \mathbb{C}, \qquad (15)$$

$$|g| = \frac{V}{I}, \text{ and} \qquad (16)$$

$$\phi_g = \phi_v - \phi_i \qquad (17)$$

provided the current phasor, i, has a non-zero absolute value obeying the expression:

$$I = |i|. \qquad (18)$$

The notion of complex impedance, complex admittance, and complex transformer gain along with phasors can also carry over to a three-phase AC power system. For example, the voltage phasor can be represented by the three-dimensional vector as follows:

$$v = \begin{bmatrix} v_A \\ v_B \\ v_C \end{bmatrix} = \begin{bmatrix} V_A e^{j\phi_{vA}} \\ V_B e^{j\phi_{vB}} \\ V_C e^{j\phi_{vC}} \end{bmatrix} \in \mathbb{C}^{3 \times 1} \qquad (19)$$

where $V_A$, $V_B$, and $V_C$ denote RMS voltage values of phases A, B, and C, and $\phi_{vA}$, $\phi_{vB}$, $\phi_{vC}$ denote the relative phase shift each of the phases. Similar to a single-phase AC network, the resulting three phase steady state current phasor can be represented by the expression:

$$i = \begin{bmatrix} i_A \\ i_B \\ i_C \end{bmatrix} = \begin{bmatrix} I_A e^{j\phi_{iA}} \\ I_B e^{j\phi_{iB}} \\ I_C e^{j\phi_{iC}} \end{bmatrix} \in \mathbb{C}^{3 \times 1} \qquad (20)$$

where $I_A$, $I_B$, and $I_C$ denote RMS current values of phases A, B, and C, and $\phi_{vA}$, $\phi_{vB}$, $\phi_{vC}$ denote the relative phase shift each of the phases. Equation (20) can be related to the three-phase voltage phasor, v, of Equation (19) via the three-phase Ohm's law, expressed by:

$$\begin{bmatrix} v_A \\ v_B \\ v_C \end{bmatrix} = G \begin{bmatrix} i_A \\ i_B \\ i_C \end{bmatrix} \qquad (21)$$

where $$G = \begin{bmatrix} g_A & g_{AB} & g_{AC} \\ g_{BA} & g_B & g_{BC} \\ g_{CA} & g_{CB} & g_C \end{bmatrix} \qquad (22)$$

or as expressed in the shorthand notation expressed by:

$$v = Gi, \qquad (23)$$

where $$v \in \mathbb{C}^{3 \times 1}, \qquad (24)$$

$$i \in \mathbb{C}^{3 \times 1}, \text{ and} \qquad (25)$$

$$G \in \mathbb{C}^{3 \times 3} \qquad (26)$$

and where the complex matrix, G, has entries $g_p$ and $g_{pm}$ with three phases A, B, and C. The complex matrix, G, can be used to determine impedances, $g_p$, and cross-impedances $g_{pm}$ between phases p and m. In some variations, the three-phase current phasor, i, in Equation (20) can be related to the voltage phasor, v, in Equation (19) via the shorthand notation expressed by:

$$i = Yv, \quad (27)$$

where $$i \in \mathbb{C}^{3 \times 1} \quad (28)$$

$$v \in \mathbb{C}^{3 \times 1}, \text{ and} \quad (29)$$

$$Y \in \mathbb{C}^{3 \times 3} \quad (30)$$

and where the complex matrix, Y, has entries $y_p$ and $y_{pm}$ with three phases A, B, and C. The complex matrix, Y, can be used to determine admittances, $y_p$, and cross-admittances $y_{pm}$ between phase p and m. The admittance matrix with the three dimensional phasor vector can be generalized to the vector notation expressed by $$i(t_j) = Y v(t_j) \quad (31)$$

where $V(t_j)$ is a multi-phase voltage phasor vector measured at a time instance j and $I(t_j)$ is a multi-phase current phasor vector measured at the time instance j. In other variations, the voltage phasor, v, can be represented by:

$$u = \begin{bmatrix} u_A \\ u_B \\ u_C \end{bmatrix} = \begin{bmatrix} U_A e^{j\phi_{uA}} \\ U_B e^{j\phi_{uB}} \\ U_C e^{j\phi_{uC}} \end{bmatrix} \in \mathbb{C}^{3 \times 1} \quad (32)$$

or expressed by the shorthand vector/matrix notation:

$$v = Ku, \quad (33)$$

where $$v \in \mathbb{C}^{3 \times 1}, \quad (34)$$

$$u \in \mathbb{C}^{3 \times 1}, \text{ and} \quad (35)$$

$$K \in \mathbb{C}^{3 \times 3} \quad (36)$$

where the complex matrix, K, has entries $k_p$ and $k_{pm}$ with three phases A, B, and C. The complex matrix, K, can be used to determine a transformer gain, $k_p$, and cross-transformer gains between phase p and m. An equivalent relationship between three-phase current phasors entering and leaving a transformer can also be determined.

The complex matrix, G, K or Y, can be a multi-input/multi-output dynamic filter, represented by a 3×3 Laplace transfer function. For simplicity in this example, consider the complex impedance matrix G(s). The complex matrix can be determined by evaluating the Laplace transfer function, G(s), at $$s = j2\pi f \quad (37)$$

where f is a fundamental AC frequency (e.g., 45-65 Hz). Estimation and monitoring the complex valued entries $g_p$ and $g_{pm}$ using Equation (22) can provide information on the three-phase impedance, admittance, and/or transformer gain values in a three-phase AC power system.

In some variations, the off-diagonal entries, $g_{pm}$, of the complex matrix, G, in Equation (22) can be different values, leading to at least nine different complex valued entries. In other variations, the off-diagonal entries, $g_{pm}$, of the complex matrix complex matrix, G, in Equation (22) can satisfy the relationship:

$$g_{pm} = g_{mp}, \quad (38)$$

making the complex matrix, G, symmetric, leading to at least six different complex values. In some other variations, a balanced AC power system can have off-diagonal entries, $g_{pm}$, satisfying the relationship of Equation (38) and the diagonal elements, $g_p$, can satisfy the following expression:

$$g_A = g_B = g_C, \quad (39)$$

leading to at least four different complex valued entries. In some variations, the diagonal elements, $g_p$, of the complex matrix, G, can satisfy the following expression:

$$g = g_A = g_B = g_C \quad (40)$$

and the off-diagonal elements, $g_{pm}$, of Equation (22) can satisfy the expression:

$$g_{pm} = 0, \quad (41)$$

and leads to a single complex valued entry and to the single-phase analysis of Equations (15)-(17).

In other variations, such as a four-wire common neutral three-phase power system, both the voltage and current phasors can be represented by:

$$v = \begin{bmatrix} v_A \\ v_B \\ v_C \\ v_N \end{bmatrix} = \begin{bmatrix} V_A e^{j\phi_{vA}} \\ V_B e^{j\phi_{vB}} \\ V_C e^{j\phi_{vC}} \\ V_N e^{j\phi_{vN}} \end{bmatrix} \in \mathbb{C}^{4 \times 1} \text{ and} \quad (42)$$

$$i = \begin{bmatrix} i_A \\ i_B \\ i_C \\ i_N \end{bmatrix} = \begin{bmatrix} I_A e^{j\phi_{iA}} \\ I_B e^{j\phi_{iB}} \\ I_C e^{j\phi_{iC}} \\ I_N e^{j\phi_{iN}} \end{bmatrix} \in \mathbb{C}^{4 \times 1} \quad (43)$$

to include the neutral voltage, $v_N$, and the neutral current, $i_N$. The size of the complex matrix can be adapted to correspond to the number of phases in a multi-phase AC power system.

In one example, for the 3×3 impedance matrix, the three-phase Ohm's law can allow the 3×3 impedance matrix to be estimated or monitored by measuring the three-phase voltage phasor, v, and current phasor, i, similar to the single-phase situation.

In order estimate and monitor of the 3×3 impedance matrix, G, multiple measurements of the voltage phasor, v, and the current phasor, i, can be taken at different points in time. The measurement of the three-phase voltage phasor, v, at the time instance, $t_k$, by the measurement of the RMS values, $V_p(t_k)$, and phase angles, $\phi_{vp}(t_k)$, of each of the phases can be represented by:

$$v_k = v(t_k) = \begin{bmatrix} v_A(t_k) \\ v_B(t_k) \\ v_C(t_k) \end{bmatrix} = \begin{bmatrix} V_A(t_k) e^{j\phi_{vA}(t_k)} \\ V_B(t_k) e^{j\phi_{vB}(t_k)} \\ V_C(t_k) e^{j\phi_{vC}(t_k)} \end{bmatrix} \quad (44)$$

To indicate the measurement of the three-phase current phasor, i, at the time instance, $t_k$, by the measurement of the RMS values, $I_p(t_k)$, and phase angles, $\phi_{ip}(t_k)$, of each of the phases can be represented by:

$$i_k = i(t_k) = \begin{bmatrix} i_A(t_k) \\ i_B(t_k) \\ i_C(t_k) \end{bmatrix} = \begin{bmatrix} I_A(t_k) e^{j\phi_{iA}(t_k)} \\ I_B(t_k) e^{j\phi_{iB}(t_k)} \\ I_C(t_k) e^{j\phi_{iC}(t_k)} \end{bmatrix} \quad (45)$$

With three distinct measurements, $i(t_k)$, of the current phasor, i, at time instances, $t_k$, and three distinct measurements, $v(t_k)$, of the voltage phasor, v, at the same time instances $t_k$, the following relationship can be established:

$$\begin{bmatrix} v_A(t_1) & v_A(t_2) & v_A(t_3) \\ v_B(t_1) & v_B(t_2) & v_B(t_3) \\ v_C(t_1) & v_C(t_2) & v_C(t_3) \end{bmatrix} = \begin{bmatrix} g_A & g_{AB} & g_{AC} \\ g_{BA} & g_B & g_{BC} \\ g_{CA} & g_{CB} & g_C \end{bmatrix} \begin{bmatrix} i_A(t_1) & i_A(t_2) & i_A(t_3) \\ i_B(t_1) & i_B(t_2) & i_B(t_3) \\ i_C(t_1) & i_C(t_2) & i_C(t_3) \end{bmatrix} \quad (46)$$

or generalized to the vector notation expressed by $$v(t_j) = G\, i(t_j) \quad (47)$$

where $V(t_1)$ is a multi-phase voltage phasor vector measured at a time instance j and $I(t_1)$ is a multi-phase current phasor vector measured at the time instance j.

Figure 1A:
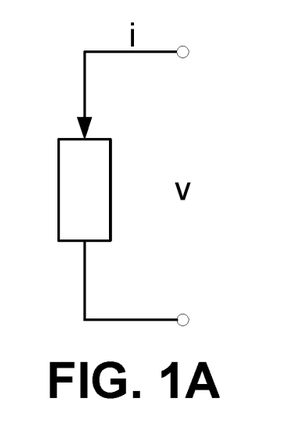
FIG. 1A illustrates a Thevenin equivalent circuit with a current flow across an electrical component(s) in the power system.
Figure 1B:
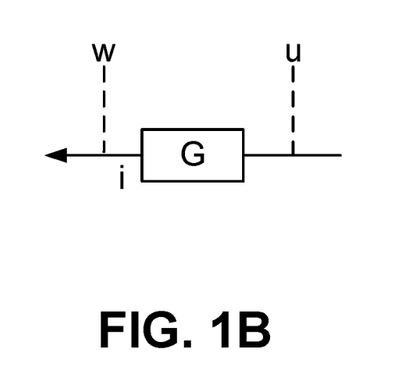
FIG. 1B illustrates a Thevenin equivalent circuit having a "through" impedance at a load or generator.
Figure 1C:
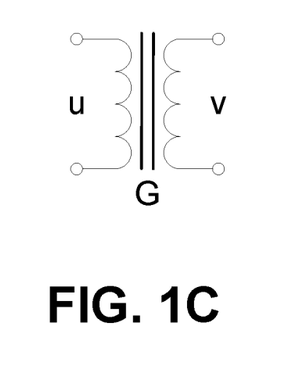
FIG. 1C illustrates a Thevenin equivalent circuit for a transformer.

FIGS. 1A-1C illustrate various impedance measurement scenarios. FIG. 1A illustrates a Thevenin equivalent circuit with a current flow across an electrical component(s) in the power system, where G is the complex matrix representing the electrical component(s), v is the voltage across the electrical component(s), i is the current through the electrical component(s). Such an electrical component can be a transmission line. For FIG. 1A, the result in Equation (47) for a three-phase electrical component with $$i = [i_2\ i_3] \in \mathbb{C}^{3\times 3} \text{ and} \quad (48)$$

$$v = [v_1\ v_2\ v_3] \in \mathbb{C}^{3\times 3} \quad (49)$$

can be used to compute Thevenin equivalent impedance matrix, G, via the expression:

$$G = [v^1\ v_2\ v_3][i_1\ i_2\ i_3]^{-1} \quad (50)$$

provided the matrix of Equation (48) is non-singular. Non-singularity or invertibility of Equation (48) can occur if the current phasors, $i_k$, at the distinct time instance, $t_k$, have enough variability in either their RMS values, $I_p(t_k)$, or phase angles, $\phi_{ip}(t_k)$, of each of the phases.

FIG. 1B illustrates a Thevenin equivalent circuit having a "through" impedance at a load or generator. In FIG. 1B, the voltage phasor measurements for a three-phase Thevenin equivalent circuit can be expressed by:

$$w = [w_1\ w_2\ w_3] \text{ and} \quad (51)$$

$$u = [u_1\ u_2\ u_3] \quad (52)$$

on either side of the component are available. In FIG. 1B, the voltage phasor difference can be expressed by:

$$[v_1\ v_2\ v_3] = [w_1\ w_2\ w_3] - [u_1\ u_2\ u_3] \quad (53)$$

and Equation (48) and the impedance matrix can be represented by:

$$G = [v_1\ v_2\ v_3][i_1\ i_2\ i_3]^{-1} \quad (54)$$

provided that Equation (48) is non-singular. Non-singularity or invertibility of Equation (48) can occur if the current phasors, $i_k$, at the distinct time instance, $t_k$, have enough variability in either their RMS values, $I_p(t_k)$, or phase angles, $\phi_{ip}(t_k)$, of each of the phases.

Voltage phasor, $v_k$, and current phasor, $i_k$, can be measured and monitored at three distinct time instances satisfying the expression:

$$t_3 > t_2 > t_1. \quad (55)$$

The invertibility of the square matrix Equation (45) can be determined by computing the condition number, K. The condition number, K, of the matrix in Equation (48) can be the ratio between the maximum and minimum singular value of the matrix. The larger the value of the condition number, K, the worse is the invertibility. A threshold value defined by:

$$K < K_{max} \quad (56)$$

can be used to populate the matrix of Equation (48) with current phasor measurements, $i_k$, at different time instances, $t_k$, before computing the impedance matrix, G, via Equation (54).

The impedance matrix, G, can be computed via Equation (54) after time instance, $t_3$. Once the impedance matrix, G, is computed, the time instances, $t_1$, $t_2$ and $t_3$ can be reset to $$t_3 = t_4,\ t_2 = t_3,\ t_1 = t_2 \quad (57)$$

and new samples can be measured and collected to re-compute the impedance matrix, G, recursively. This recursive approach based on a square matrix of Equation (48) allows the impedance matrix, G, to be estimated at various time instances, $t_n$, where the time instance, $t_n$, can be based on the recursive update of the time index, $t_3$. The recursive approach allows the monitoring of any time dependent changes of the impedance matrix, $G(t_n)$.

In some variations, the result in Equation (47) with Equations (48) and (49) satisfied, demonstrates that the Thevenin equivalent impedance matrix, G, in FIG. 1A or the component admittance in FIG. 1B can be estimated via Equation (54) provided that Equation (49) results in a non-singular matrix. Non-singularity or invertibility of Equation (49) can occur if the voltage phasors, $v_k$, at the distinct time instance, $t_k$, have enough variability in either their RMS values, $V_p(t_k)$, or phase angles, $\phi_{vp}(t_k)$, of each of the phases. The same recursive approach as used for the square matrix Equation (48) can be used for the square matrix of Equation (49) to compute the impedance matrix, G, at various time instances, $t_n$.

FIG. 1C illustrates a Thevenin equivalent circuit for a three-phase transformer. In FIG. 1C, the voltage phasor measurements expressed by:

$$v = [v_1\ v_2\ v_3] \in \mathbb{C}^{3\times 3} \text{ and} \quad (58)$$

$$u = [u_1\ u_2\ u_3] \in \mathbb{C}^{3\times 3}. \quad (59)$$

on either side of the transformer can be measured. In FIG. 1C, the three-phase transformer gain, K, can relate the voltage phasors via the expression:

$$[u_1\ u_2\ u_3] = K \cdot [v_1\ v_2\ v_3]^{-1} \quad (60)$$

An equivalent transformer gain, K, can be estimated via the expression:

$$K = [u_1\ u_2\ u_3][v_1\ v_2\ v_3]^{-1} \quad (61)$$

provided that the matrix generated using Equation (58) is non-singular. Non-singularity or invertibility of Equation (58) can occur if the voltage phasors, $v_k$, at the distinct time instance, $t_k$, have enough variability in either their RMS values, $V_p(t_k)$, or phase angles, $\phi_{vp}(t_k)$, of each of the phases. A similar approach can also be taken with the three-phase current phasors measured on each side of the transformer.

In some variations, a moving window with a variable or fixed length of N measurements of the voltage phasors, $v_k$, and current phasors, $i_k$, at distinct time instances, $t_k$, where $$k = n - N + 1, n - N, \ldots, n \quad (62)$$

can be used to formulate the relationship represented by:

$$[v_{n-N+1}\ v_{n-N}\ \cdots\ v_n] = G_n [i_{n-N+1}\ i_{n-N} \ldots i_n] \quad (63)$$

where $$G(t_n) = G_n \in \mathbb{C}^{3\times 3} \quad (64)$$

refers to a moving averaged Thevenin equivalent impedance matrix at time instance, $t_n$, over the time interval, $t_k$. The moving window length, N, can be chosen as $$N=3, \quad (65)$$

reducing Equation (63) back to Equation (47).

If the moving window length, N, is a value chosen that exceeds 3, the moving averaged impedance matrix, $G_n$, can be calculated at time instance, $t_n$ via a form of least squares optimization or weighted least squares optimization such as, but not limited to steady-state Kalman filtering or Quadratic Optimization. The solution to such least squares optimization results is given by the least squares estimate as follows:

$$G_n = [v_{n-N+1}\, v_{n-N}\, \ldots\, v_n][i_{n-N+1}\, i_{n-N}\, \ldots\, i_n]^\perp \quad (66)$$

where $[\cdot]^\perp$ denotes the right inverse of the matrix $[\cdot]$. The right inverse $[\cdot]^\perp$ in Equation (66) can exist if the non-square matrix of $$[i_{n-N+1}\, i_{n-N}\, \ldots\, i_n] \in \mathbb{C}^{3 \times N} \quad (67)$$

has full row rank. Such a condition can be satisfied by choosing a moving window length, N, large enough to have enough variability in the current phasors, $i_k$, at distinct time instances, $t_k$.

The impedance matrix, $G_n$, computed via Equation (66) can become available after time instance, $t_n$. Once the impedance matrix, $G_n$, is available, the time index, n, can be updated to $$n = n+1 \quad (68)$$

and one measurement of the phasors at $t_{n+1}$ can be collected to recompute the impedance matrix, $G_n$. This recursive approach based on a moving window non-square matrix expressed by Equation (67) allows the impedance matrix, G, to be estimated at various time instances, $t_n$ where the time instance, $t_n$, is based on the recursive update of the time index, $t_n$. The recursive approach allows the monitoring of any time dependent changes of the impedance matrix, G($t_n$).

The length, N, of the window may be fixed or adjusted to ensure that the moving window non-square matrix of Equation (67) has full row rank.

In other variations, the least squares estimate used to compute the moving averaged impedance matrix, $G_n$, at time instance, $t_n$, can be regularized to ensure the right inverse $[\cdot]^\perp$ in Equation (66) exists. For a regularized least squares estimate, the right inverse $[\cdot]^\perp$ is given by $$[\cdot]^\perp = [\cdot]^T (\lambda + [\cdot][\cdot]^T)^{-1} \quad (69)$$

where $\lambda > 0$ is chosen such that the inverse of $\lambda + [\cdot][\cdot]^T$ is well defined.

In yet other variations, the least squares estimate used to compute the moving averaged impedance matrix, $G_n$, at time instance, $t_n$, can be enforced to satisfy particular constraints. With the complex impedance matrix, G, given in Equation (22), such constraints may include the off-diagonal entries, $g_{pm}$, of the complex matrix complex matrix, $G_n$, to satisfy Equation (38) making the complex matrix, $G_n$, symmetric and leading to the estimation of about six different complex valued entries in $G_n$ instead of nine. In some other variations, a balanced AC power system, where in addition to the off-diagonal entries $g_{pm}$ of $G_n$ satisfying Equation (38), the diagonal elements $g_p$ of $G_n$ satisfy Equation (39), leading to three different complex valued entries in $G_n$ to be estimated instead of nine. In other variations, the diagonal elements $g_p$ of $G_n$ satisfy Equation (40) and the off-diagonal elements $g_{pm}$ of $G_n$ satisfying Equation (41), leads to a single complex valued entry g in $G_n$ and leading to the single-phase analysis of Equations (15)-(17).

The calculations in Equation (61), (63), or (69), the current phasors, $i_k$, voltage phasors, $v_k$, and the entries $g_p$ and $g_{pm}$ of the complex matrix $G_n$ can be represented in polar coordinates or rectangular coordinates. Depending on the computations performed to compute the complex matrix, $G_n$, a phasor in Equation (1) can be represented in its rectangular coordinates as follows:

$$v = Re\{v\} + j \cdot Im\{v\}, \quad (70)$$

where $$Re\{v\} = V \cos \phi_v, \text{ and} \quad (71)$$

$$Im\{v\} = V \sin \phi_v. \quad (72)$$

With such rectangular coordinates, the estimation of the complex matrix $G_n$ can also be split into the estimate of its real part, $Re\{G_n\}$, and imaginary part, $Im\{G_n\}$, to construct the complex matrix estimate $$G_n = Re\{G_n\} + j \, \phi Im\{G_n\}. \quad (73)$$

To determine the least squares estimate of the moving averaged impedance matrix, $G_n$, at time instance, $t_n$, and the covariance, cov($G_n$), of the moving averaged impedance matrix, $G_n$, can be determined via $$\text{cov}(G_n) = Q_n[i_{n-N+1}\, i_{n-N}\, \cdots\, i_n]^\perp \quad (74)$$

where $$Q_n = [e_{n-N+1}\, e_{n-N}\, \cdots\, e_n][e_{n-N+1}\, e_{n-N}\, \cdots\, e_n]^\perp \quad (75)$$

indicates the covariance of the measurement noise $e_k$, on the measurements of the voltage phasor $v_k$. The covariance cov($G_n$) can be used to quantify the statistical confidence level of the elements of the moving averaged impedance matrix, $G_n$.

This recursive approach allows the monitoring of any time dependent electrical characteristics such as changes of the impedance, admittance or transformer gain matrix, $G_n$. These include the real and reactive components of the elements $g_p(t_n)$ on the diagonal and the elements $g_{p,n}(t_n)$ in the off-diagonal components of the matrix $$G_n = G(t_n) = \begin{bmatrix} g_A(t_n) & g_{AB}(t_n) & g_{AC}(t_n) \\ g_{BA}(t_n) & g_B(t_n) & g_{BC}(t_n) \\ g_{CA}(t_n) & g_{CB}(t_n) & g_C(t_n) \end{bmatrix} \quad (76)$$

In one variation, such information can be used to estimate the value of ohm, mho, transformer gain at either a single point in the grid, such as a point of interconnection (POI) between a load and the grid; or the impedance between two measurement points in the grid.

Due to ability to monitor time dependent changes of the impedance, admittance, or transformer gain matrix, G($t_n$), in another variation, the information in G($t_n$) can be used to detect changes in ohm, mho, transformer gain. Additionally, both the changes in real and imaginary value of the complex matrix, G($t_n$), and their time dependency can also provide information to classify the possible cause for the observed changes in impedance, admittance, or transformer gain of the components in an AC grid via more detailed analytics of the time dependent changes of G($t_n$)

The distance to a fault on a power line can be determined by estimating the impedance change at the point of the measurement. For a well-balanced component in an AC grid, the matrix $G(t_n)$ should be diagonal. Off-diagonal elements can represent leakage and/or interference impedance between phases of the power system. As both diagonal and off-diagonal elements are determined for the complex impedance matrix, $G(t_n)$, monitoring of these elements in real time enables the detection of anomalies in a component on the AC grid being assessed.

For analytics, any linear weighted combination on the elements of the complex impedance matrix, $G(t_n)$, given in Equation (76) can be used. In one example, such linear weighted combination can be given by:

$$d(t_n) = \Sigma_{p=A,B,C} \alpha_p \cdot g_p(t_n) + \Sigma_{p,m=A,B,C} \beta_{pm} \cdot g_{pm}(t_n) \qquad (77)$$

where the weightings $a_p$ and $\beta_{pm}$ can be used to normalize the diagonal and off-diagonal elements in complex impedance matrix $G(t_n)$ respectively. In another example, a linear weighting can be given by:

$$d(t_n) = \Sigma_{p=A,B,C} \alpha_p \cdot (g_p(t_n) - g_p^{nom}) + \Sigma_{p,m=A,B,C} \beta_{pm} \cdot (g_{pm}(t_n) - g_p^{nom}) \qquad (78)$$

where the weightings $\alpha_p$ and $\beta_{pm}$ are used to modify deviations from the nominal values $g_p^{nom}$ and $g_{pm}^{nom}$ of the diagonal and off-diagonal elements in complex impedance matrix, $G(t_n)$, respectively.

One means of determining if a component is deviating from its normal operation can be based on the complex signal $d(t_n)$ in Equations (77) and (78). Statistical and time-series data analysis techniques can be used to determine variations and deviations of a component to reflect an anomaly on the AC power system being assessed.

Figure 2:
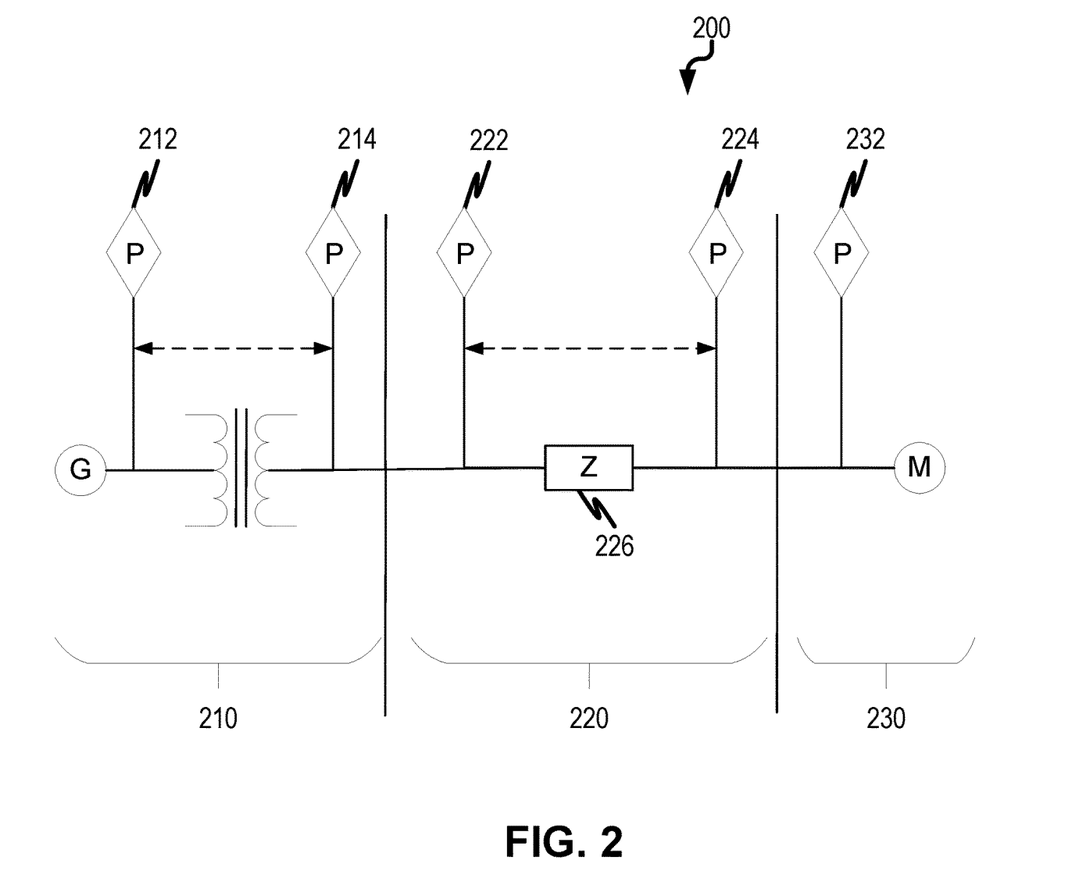
FIG. 2 illustrates an example power system having electrical components.

FIG. 2 illustrates an example power system 200 having electrical components. Multiple measurements can be taken from power system 200 and used to compute an estimate of the impedance parameters as well as the estimated variance of the impedance parameters.

In measuring impedance across an electrical component in power system 300, such as a transmission line, the impedance can be estimated based on measurements at each end of the transmission line (e.g., at points P 222, 224) and the resulting impedance Z 226 can represent the total impedance between the measurement points as illustrated in example 220. In FIG. 2, G represents a generation source and M represents an example measuring point of the power system 200.

Measuring a "through" impedance to compute the Thevenin impedance can be performed at a load (M) (e.g., point 232) or generator (G) (e.g., point 212) as illustrated in example 230. With a load or generator, there are three complex valued voltages and three complex valued currents measurements providing at least twelve measurements.

Impedance can also be measured for a three-phase transformer as illustrated in example 210 (e.g., across points 212, 214). Three-phase transformers can have three input phases and three output phases and a neutral. Ignoring the neutral for the moment, there are nine complex transformer gain values and thus nine real numbers and nine imaginary numbers that represent the overall condition of the transformer. The voltage and current of the A, B, and C phases on the high side and the voltage and current of the A, B, and C phases on the low side are measured synchronously. The data rates are typically up to 60 Hz, thus six complex valued voltages and six complex valued currents each with magnitude and phase angle are measured synchronously giving a total of twenty four simultaneous real valued measurements. Based on Ohm's law, the voltage difference can be required to compute impedance. This leaves twelve independent measurements to compute eighteen values of impedance. This is not solvable.

The nine complex valued components or eighteen real and imaginary components of impedance matrix, are represented as a 3×3 complex matrix, can be computed using the methods described herein. Consider the example of a transformer being analyzed in real time with the admittance, Y, computed at 60 Hz rates. That is every 16.6 mS a new set of eighteen values and their covariance are available, giving a total of 36 parameter values. These are stored in a time series database so the history of these parameter values is also available.

The following can represent an admittance, Y:

$$Y = \begin{bmatrix} Y_{ax} & Y_{abx} & Y_{acx} \\ Y_{bax} & Y_{bx} & Y_{bcx} \\ Y_{cax} & Y_{cbx} & Y_{cx} \end{bmatrix} + j \begin{bmatrix} Y_{ay} & Y_{aby} & Y_{acy} \\ Y_{bay} & Y_{by} & Y_{bcy} \\ Y_{cay} & Y_{cby} & Y_{cy} \end{bmatrix} \qquad (79)$$

where admittance, Y, can represent eighteen admittances, $Y_{ax}$ is the real component of the admittance between "A" phase on high side terminal (e.g., bushing) of the transformer and the "A" phase terminal on the low side of the transformer, $Y_{ay}$ is the symbol for the imaginary part of the admittance between "a" terminals. Similarly, $Y_{bx}$, $Y_{by}$, $Y_{cx}$, and $Y_{cy}$ are the real and imaginary components of the "diagonal" elements in the admittance matrix. The off-diagonal elements are denoted by $Y_{abx}$, $Y_{acx}$, $Y_{bcx}$, $Y_{bax}$, $Y_{cbx}$, $Y_{cax}$, $Y_{aby}$, $Y_{acy}$, $Y_{bay}$, $Y_{cby}$, and $Y_{cay}$.

In a well-conditioned transformer, the admittance matrix would be diagonal, and these elements would have nearly the same value. The off-diagonal elements would be zero. If there is power flow between the "A" phase and the "B" phase inside the transformer, the admittance, $Y_{abx}$, $Y_{aby}$, $Y_{bax}$, and $Y_{bay}$ will be non-zero. By estimating and monitoring such 3×3 complex admittance matrix, one could determine that an anomaly exists in the bushings, windings, or the electrical insulation medium such as oil and paper between phase A and phase B. This insight can provide an early indication of a potential transformer problem, thus allowing the owner to schedule a maintenance shutdown to examine the transformer. The impedance matrix can also be used to determine insulation deterioration of windings in motors or generators, shorts or intermittent grounding issues or shifting of the rotor windings including overheating of the windings that will increase the impedance.

Recursive and windowed estimate of impedance can also apply to power lines, loads, motors, generators, and/or at any point of interest in the grid including at the point of interconnection (POI) of a microgrid.

In the case of overhead or underground power line monitoring this improved estimation of an impedance matrix can be used to determine phase to phase faults, phase to ground faults such as tree contact on one or more phases of a multi-phase power line.

Figure 3:
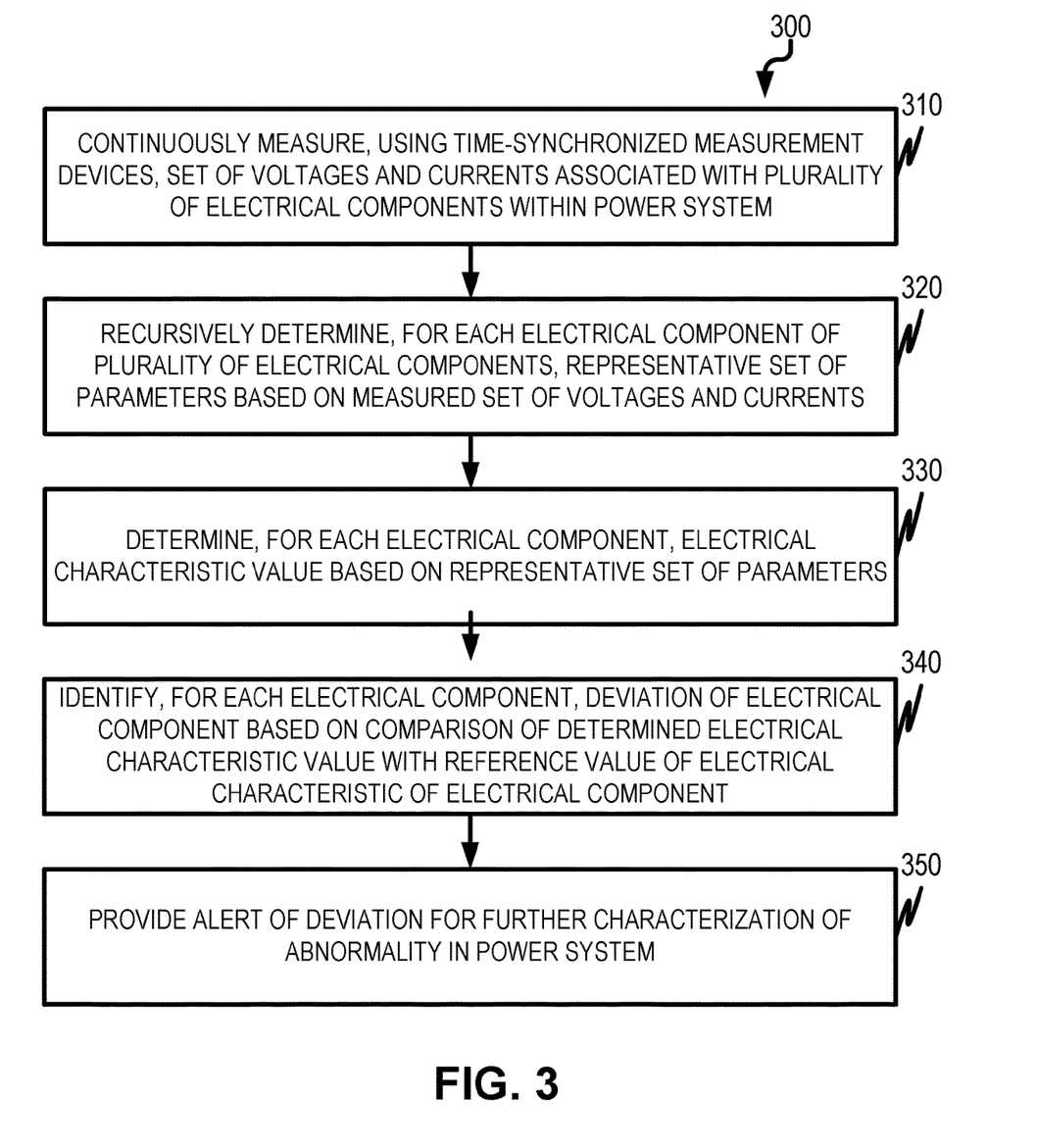
FIG. 3 is a process flow diagram illustrating a method of recursive window estimation.

FIG. 3 is a process flow diagram 300 of identifying deviations of a power system. Using time-synchronized measurement devices, a set of voltages and currents associated with a plurality of electrical components within the power system can be continuously measured, at 310. For each electrical component of the plurality of electrical components, a representative set of parameters based on the measured set of voltages and currents can be recursively determined, at 320, at different points in time. For each electrical component, an electrical characteristic value can be determined, at 330, based on the representative set of parameters. A deviation of each electrical component can be identified, at 340, based on comparison of the determined electrical characteristic value with a reference value of the electrical characteristic of the electrical component. An alert of the deviation can be provided, at 350, for further characterization of an abnormality in the power system.

Figure 4:
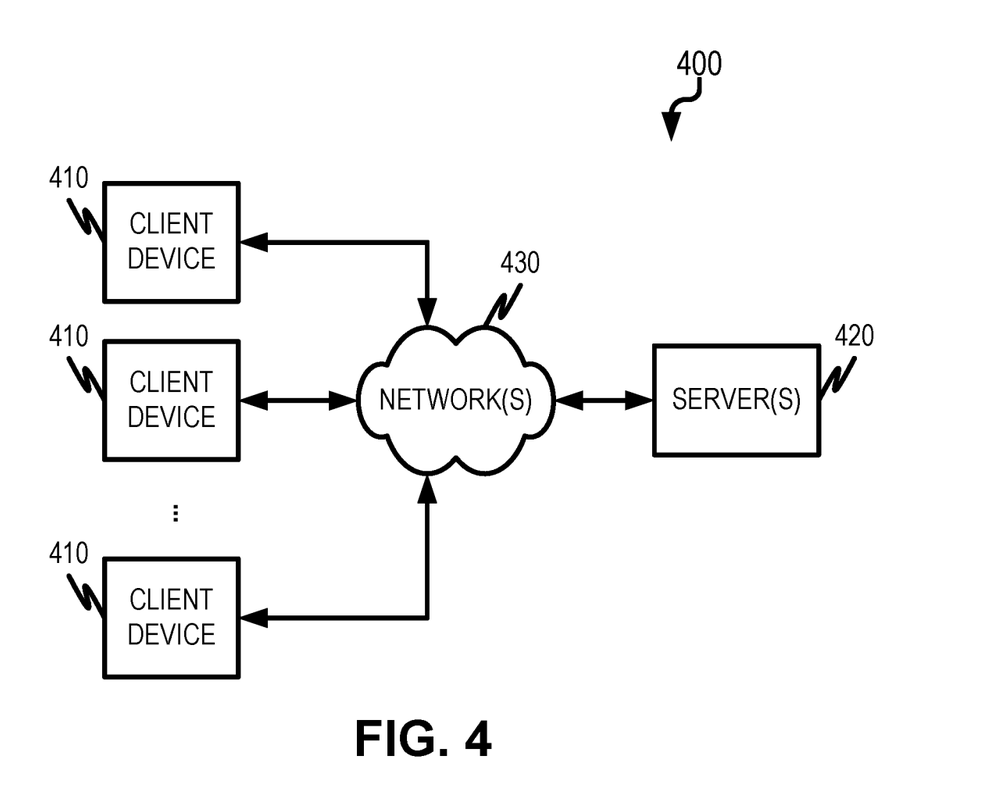
FIG. 4 is a system block diagram illustrating an architecture for use in connection with the current subject matter.

FIG. 4 is a system block diagram illustrating an architecture 400 for use in connection with the current subject matter. The current subject matter is described in connection with an arrangement involving one or more client devices 410 and one or more servers 420 which can communicate over one or more networks 430. Each of the one or more client devices 410 and the one or more servers 420 comprise one or more programmable data processors and memory for storing instructions for executed by such data processor(s). Furthermore, it will be appreciated that each of the client devices 410 or servers 420 can comprise more than one computing device depending on the desired configuration and that the illustrations in FIG. 4 is simplified to aid in the understanding of the current subject matter.

The functional blocks described herein can be implemented in commercial computing platforms such as advanced Programmable Logic Controllers (PLCs) or in industrial grade PCs such as the Schweitzer Engineering Laboratories (SEL) 3355 Industrial Personal Computer (PC) that runs multiple tasks, one of which is the controller. The controller processing functionality can be written in any computer language, but one implementation is using C++ running on Windows or Linux operating systems. The output commands from then controller may use standard control protocols such as IEC 61850 Goose or Modbus over Ethernet. In order to maintain high security, fiber optic connections can be used between the controller platform and the providers and/or consumers of the power grid.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system can include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "computer-readable medium" refers to any computer program product, apparatus and/or device, such as for example magnetic discs, optical disks, memory, and Programmable Logic Devices (PLDs), used to provide machine instructions and/or data to a programmable processor, including a computer-readable medium that receives machine instructions as a computer -readable signal. The term "computer-readable signal" refers to any signal used to provide machine instructions and/or data to a programmable processor. The computer-readable medium can store such machine instructions non-transitorily, such as for example as would a non-transient solid-state memory or a magnetic hard drive or any equivalent storage medium. The computer-readable medium can alternatively or additionally store such machine instructions in a transient manner, for example as would a processor cache or other random access memory associated with one or more physical processor cores.

Figure 5:
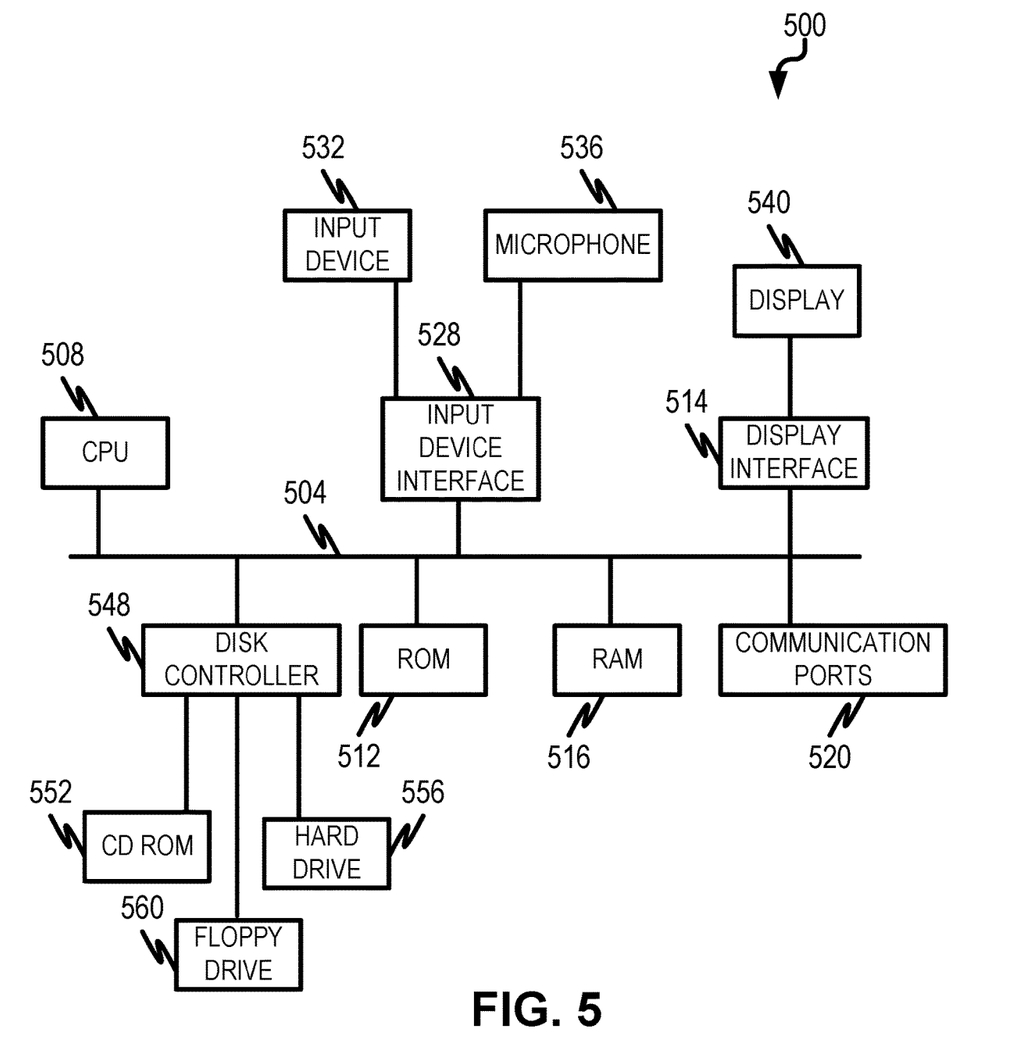
FIG. 5 is a diagram illustrating a sample computing device architecture for implementing various aspects described herein.

FIG. 5 is a diagram illustrating a sample computing device architecture 500 for implementing various aspects described herein. A system bus 504 can serve as the information highway interconnecting the other illustrated components of the hardware. A processing system 508 labeled CPU (central processing unit) (e.g., one or more computer processors/data processors at a given computer or at multiple computers), can perform calculations and logic operations required to execute a program. A non-transitory processor-readable storage medium, such as read only memory (ROM) 512 and random access memory (RAM) 516, can be in communication with the processing system 508 and can include one or more programming instructions for the operations specified here. Optionally, program instructions can be stored on a non-transitory computer-readable storage medium such as a magnetic disk, optical disk, recordable memory device, flash memory, or other physical storage medium.

In one example, a disk controller 548 can interface one or more optional disk drives to the system bus 504. These disk drives can be external or internal floppy disk drives such as 560, external or internal CD-ROM, CD-R, CD-RW or DVD, or solid state drives such as 552, or external or internal hard drives 656. As indicated previously, these various disk drives 552, 556, 560 and disk controllers are optional devices. The system bus 504 can also include at least one communication port 520 to allow for communication with external devices either physically connected to the computing system or available externally through a wired or wireless network. In some cases, the communication port 520 includes or otherwise comprises a network interface.

To provide for interaction with a user, the subject matter described herein can be implemented on a computing device having a display 540 (e.g., a CRT (cathode ray tube) or LCD (liquid crystal display) monitor) for displaying information obtained from the system bus 504 to the user and an input device 532 such as keyboard and/or a pointing device (e.g., a mouse or a trackball) and/or a touchscreen by which the user can provide input to the computer. Other kinds of input devices 532 can be used to provide for interaction with a user as well; for example, feedback provided to the user can be any form of sensory feedback (e.g., visual feedback, auditory feedback by way of a microphone 536, or tactile feedback); and input from the user can be received in any form, including acoustic, speech, or tactile input. In the input device 532 and the microphone 536 can be coupled to and convey information via the system bus 504 by way of an input device interface 528. Other computing devices, such as dedicated servers, can omit one or more of the display 540 and display interface 514, the input device 532, the microphone 536, and input device interface 528.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an un-recited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A method for identifying deviations in electrical parameters within a power system, the method comprising:
    continuously measuring, using time-synchronized measurement devices, a set of voltages and currents associated with a plurality of electrical components within the power system;
    recursively computing, using a moving window comprising two or more most recent time instances, for each electrical component of the plurality of electrical components, a representative set of electrical parameters based on the measured set of voltages and currents at each of the two or more recent time instances, wherein the moving window is of a variable window length;
    determining, for each electrical component based on the recursive computing, an electrical characteristic matrix based on the representative set of electrical parameters, wherein the electrical characteristic matrix comprises a plurality of elements representing real components and imaginary components;
    identifying, for each electrical component based on the recursive computing, a deviation of at least one element of the plurality of elements based on comparison of the at least one element with a reference matrix of the electrical component;
    determining, in real-time based on the recursive computing, an estimated distance to the deviation based on recursive calculations of a change between the at least one element at (i) a first measurement time instance prior to the identified deviation at a first point within the power system and (ii) a second measurement time instance after the identified deviation at a second point within the power system, wherein the two or more most recent time instances comprise the first measurement time instance and the second measurement time instance; and
    providing an alert of the deviation for further characterization of an abnormality in the power system.

2. The method of claim 1, wherein the providing causes a remedial action to be taken in the power system, wherein the remedial action comprises at least one of: automatically alerting a power system operator via a visual or data interface of the deviation, automatically isolating at least one electrical component of the plurality of electrical components from the power system, or automatically initiating a new set point based on the deviation.

3. The method of claim 1, wherein an electrical component of the plurality of electrical components is a transformer, a sectionalizing device, a power line segment, an electrical substation, a portion of a transmission system, or a portion of a distribution feeder in the power system.

4. The method of claim 1, wherein the reference matrix is one of a previously recursively determined steady state electrical characteristic value or a predetermined reference value.

5. The method of claim 1, wherein the deviation indicates a fault on a power line of the power system.

6. The method of claim 1, wherein the change between the at least one element at the first measurement time and the second measurement time correlates with the estimated distance to the deviation from the first point to the second point.

7. The method of claim 1, wherein each of the plurality of elements is determined at an electrical point of the power system or across at least two electrical points of the power system.

8. The method of claim 1, wherein the electrical characteristic matrix comprises at least one of: an impedance or admittance across a transformer of the power system, a voltage reduction of the transformer of the power system, an amplification of the transformer, a current reduction of the transformer, an amplification of the transformer, an impedance across a power line segment of the power system, an admittance across the power line segment, or an impedance at a measuring point of at least one time-synchronized measurement device of the time-synchronized measurement devices between a load coupled to the power system and the power system.

9. The method of claim 1, wherein the power system is a single-phase electrical power grid and the representative set of electrical parameters are determined using a Thevenin equivalent impedance model represented by:

$$v = gi$$

where v is a voltage phasor, i is a current phasor, and g is a Thevenin equivalent value of impedance.

10. The method of claim 1, wherein the electrical power system is a single-phase electrical power grid and the representative set of electrical parameters are determined using a Thevenin equivalent admittance model represented by:

$$i = yv$$

where v is a voltage phasor, i is a current phasor, and y is a Thevenin equivalent value of admittance.

11. The method of claim 1, wherein the power system comprises a multi-phase electrical power grid and the representative set of electrical parameters are determined using a Thevenin equivalent impedance model represented by:

$$V(t_j) = G\ I(t_j)$$

where $V(t_j)$ is a multi-phase voltage phasor vector measured at a time instance j, $I(t_j)$ is a multi-phase current phasor vector measured at the time instance j, and G is a square symmetric matrix representing a Thevenin equivalent value for an impedance of a multi-phase system.

12. The method of claim 11, wherein the dimensions of the multi-phase voltage phasor vector, $V(t_j)$, the multi-phase current phasor vector, $I(t_j)$ and the square symmetric matrix, G, is equal to a number of phases of the multi-phase electrical power grid.

13. The method of claim 12, wherein the multi-phase voltage phasor vector $V(t_j)$ is determined at an electrical point of the multi-phase electrical power grid or determined as a voltage difference between at least two electrical points of the multi-phase electrical power grid.

14. The method of claim 1, wherein the power system comprises a multi-phase electrical power grid and the representative set of electrical parameters are determined using a Thevenin equivalent admittance model represented by:

$$I(t_j) = Y\, V(t_j)$$

where $V(t_j)$ is a multi-phase voltage phasor vector measured at a time instance j, $I(t_j)$ is a multi-phase current phasor vector measured at the time instance, j, and Y is a square symmetric matrix representing a Thevenin equivalent value for an admittance of the multi-phase electrical power grid.

15. The method of claim 14, wherein the dimensions of the multi-phase voltage phasor vector, $V(t_j)$, the multi-phase current phasor vector, $I(t_j)$ and the square symmetric matrix, Y, is equal to a number of phases of the multi-phase electrical power grid.

16. The method of claim 14, wherein the multi-phase voltage phasor vector, $V(t_j)$, is determined at an electrical point of the multi-phase electrical power grid or determined as a voltage difference between at least two electrical points of the multi-phase electrical power grid.

17. A system for identifying deviations in electrical parameters within a power system, the system comprising:
   at least one data processor;
   memory storing instructions, which when executed by at least one data processor, result in operations comprising:
   continuously measuring, using time-synchronized measurement devices, a set of voltages and currents associated with a plurality of electrical components within the power system;
   recursively computing, using a moving window comprising two or more most recent time instances, for each electrical component of the plurality of electrical components, a representative set of electrical parameters based on the measured set of voltages and currents at each of the two or more recent time instances, wherein the moving window is of a variable window length;
   determining, for each electrical component based on the recursive computing, an electrical characteristic matrix based on the representative set of electrical parameters, wherein the electrical characteristic matrix comprises a plurality of elements representing real components and imaginary components;
   identifying, for each electrical component based on the recursive computing, a deviation of at least one element of the plurality of elements based on comparison of the at least one element with a reference value of the electrical component;
   determining, in real time based on the recursive computing, an estimated distance to the deviation based on recursive calculations of a change between the at least one element at (i) a first measurement time instance prior to the identified deviation at a first point within the power system and (ii) a second measurement time instance after the identified deviation at a second point within the power system, wherein the two or more most recent time instances comprise the first measurement time instance and the second measurement time instance; and
   providing an alert of the deviation for further characterization of an abnormality in the power system.

18. The system of claim 17, wherein the providing causes a remedial action to be taken in the power system, wherein the remedial action comprises at least one of: automatically alerting a power system operator via a visual or data interface of the deviation, automatically isolating at least one electrical component of the plurality of electrical components from the power system, or automatically initiating a new set point based on the deviation.

19. The system of claim 17, wherein an electrical component of the plurality of electrical components is a transformer, a sectionalizing device, a power line segment, an electrical substation, a portion of a transmission system, or a portion of a distribution feeder in the power system.

20. The system of claim 17, wherein the reference matrix is one of a previously recursively determined steady state electrical characteristic value or a predetermined reference value.

21. The system of claim 17, wherein the deviation indicates a fault on a power line of the power system.

22. The system of claim 17, wherein the change between the at least one element at the first measurement time and the second measurement time correlates with the estimated distance to the deviation from the first point to the second point.

23. The system of claim 17, wherein the each of the plurality of elements is determined at an electrical point of the power system or across at least two electrical points of the power system.

24. The system of claim 17, wherein the electrical characteristic matrix comprises at least one of: an impedance or admittance across a transformer of the power system, a voltage reduction of the transformer of the power system, an amplification of the transformer, a current reduction of the transformer, an amplification of the transformer, an impedance across a power line segment of the power system, an admittance across the power line segment, or an impedance at a measuring point of at least one time-synchronized measurement device of the time-synchronized measurement devices between a load coupled to the power system and the power system.

25. The system of claim 17, wherein the power system is a single-phase electrical power grid and the representative set of electrical parameters are determined using a Thevenin equivalent impedance model represented by:

$$v = gi$$

where v is a voltage phasor, i is a current phasor, and g is a Thevenin equivalent value of impedance.

26. The system of claim 17, wherein the electrical power system is a single-phase electrical power grid and the representative set of electrical parameters are determined using a Thevenin equivalent admittance model represented by:

$$i = yv$$

where v is a voltage phasor, i is a current phasor, and y is a Thevenin equivalent value of admittance.

27. The system of claim 17, wherein the power system comprises a multi-phase electrical power grid and the representative set of electrical parameters are determined using a Thevenin equivalent impedance model represented by:

$$V(t_j) = G\, I(t_j)$$

where $V(t_j)$ is a multi-phase voltage phasor vector measured at a time instance j, $I(t_j)$ is a multi-phase current phasor vector measured at the time instance j, and G is a square symmetric matrix representing a Thevenin equivalent value for an impedance of a multi-phase system.

28. The system of claim 27, wherein the dimensions of the multi-phase voltage phasor vector, $V(t_j)$, the multi-phase current phasor vector, $I(t_j)$ and the square symmetric matrix, G, is equal to a number of phases of the multi-phase electrical power grid.

29. The system of claim 28, wherein the multi-phase voltage phasor vector $V(t_j)$ is determined at an electrical point of the multi-phase electrical power grid or determined as a voltage difference between at least two electrical points of the multi-phase electrical power grid.

30. The system of claim 17, wherein the power system comprises a multi-phase electrical power grid and the representative set of electrical parameters are determined using a Thevenin equivalent admittance model represented by:

$$I(t_j) = Y\, V(t_j)$$

where $V(t_j)$ is a multi-phase voltage phasor vector measured at a time instance j, $I(t_j)$ is a multi-phase current phasor vector measured at the time instance, j, and Y is a square symmetric matrix representing a Thevenin equivalent value for an admittance of the multi-phase electrical power grid.

31. The system of claim 30, wherein the dimensions of the multi-phase voltage phasor vector, $V(t_j)$, the multi-phase current phasor vector, $I(t_j)$ and the square symmetric matrix, Y, is equal to a number of phases of the multi-phase electrical power grid.

32. The system of claim 31, wherein the multi-phase voltage phasor vector, $V(t_j)$, is determined at an electrical point of the multi-phase electrical power grid or determined as a voltage difference between at least two electrical points of the multi-phase electrical power grid.

33. A non-transitory computer program product for identifying deviations in electrical parameters within a power system, the non-transitory computer program product storing instructions, which when executed by at least one data processor forming part of at least one computing device, result in operations comprising:

continuously measuring, using time-synchronized measurement devices, a set of voltages and currents associated with a plurality of electrical components within the power system;

recursively computing, using a moving window comprising two or more most recent time instances, for each electrical component of the plurality of electrical components, a representative set of electrical parameters based on the measured set of voltages and currents at each of the two or more recent time instances, wherein the moving window is of a variable window length;

determining, for each electrical component based on the recursive computing, an electrical characteristic matrix based on the representative set of electrical parameters, wherein the electrical characteristic matrix comprises a plurality of elements representing real components and imaginary components;

identifying, for each electrical component based on the recursive computing, a deviation of at least one element of the plurality of elements based on comparison of the at least one element with a reference value of the electrical component;

determining, in real-time based on the recursive computing, an estimated distance to the deviation based on recursive calculations of a change between the at least one element at (i) a first measurement time instance prior to the identified deviation at a first point within the power system and (ii) a second measurement time instance after the identified deviation at a second point within the power system, wherein the two or more most recent time instances comprise the first measurement time instance and the second measurement time instance; and providing an alert of the deviation for further characterization of an abnormality in the power system.

* * * * *